United States Patent [19]

Nigon et al.

[11] Patent Number: 4,998,059

[45] Date of Patent: Mar. 5, 1991

[54] DUAL DEMODULATING CIRCUIT TRACER

[75] Inventors: Richard T. Nigon, Sterling, Va.;
David P. Bochinski, Columbia, Md.;
Roy H. Long, Jr., Manassas; James
A. Kallio, Falls Church, both of Va.

[73] Assignee: The United States of America as represented by the Secretary of the Navy, Washington, D.C.

[21] Appl. No.: 500,337

[22] Filed: Mar. 28, 1990

[51] Int. Cl.[5] .......................................... G01R 19/00
[52] U.S. Cl. .................................................... 324/67
[58] Field of Search ............................ 324/66, 67, 326

[56] References Cited

U.S. PATENT DOCUMENTS

| 4,491,785 | 1/1985 | Pecukonis | 324/67 |
| 4,686,454 | 8/1987 | Pecukonis | 324/67 |

Primary Examiner—Walter E. Snow
Attorney, Agent, or Firm—Luther A. Marsh; John H. Stowe

[57] ABSTRACT

A non intrusive circuit tracer for positively identifying a conductor at position remote from a point of injection of a test signal. Tracer signal is alternately injected into two conductors at a rate of alternation which is substantially less than the tracer frequency. At another point along the conductor signal is sampled and synchronously demodulated first with respect to the tracer frequency and then with respect to the rate of alternation of the tracer frequency between conductors.

6 Claims, 4 Drawing Sheets

DUAL DEMODULATING CIRCUIT TRACER

BACKGROUND OF THE INVENTION

1. Field of the Invention

This invention relates to the field of tracing continuity in bundles or arrays of electrical conductors in cables and electronic equipment and especially to tracing continuity under conditions where an injected tracer signal is likely to cross into an adjacent conductor by stray or unintended capacitive coupling.

2. Background Information

In the troubleshooting of electronic hardware, it is quite often necessary to find or trace a particular wire in a bundle of wires. Since the color coding of the individual wires in a bundle is not generally unique, one standard procedure now employed is to disassemble a cable or wire bundle far enough to be able to allow the stripping of the insulation of the individual wires. A continually checker is then used to identify individual conductors. The limitations of this approach are that the mechanical and electrical integrity of the wire bundle or cable is comprised by this procedure.

It is preferable to be able to trace electrical conductors, to isolate one particular conductor from a number of other conductors, and to positively identify a conductor in relation to other conductors in close proximity with the least amount of intrusion into the insulation system of the conductors. One type of tracing system is disclosed in U.S. Pat. No. 4,491,785 to Pecukonis. In Pecukonis a shaped waveform is conducted into a conductor such as an outlet of an electrical distribution system. The pulses are alternated with a rest period. The magnitude of the pulses in sufficiently high such that an electromagnetic field is generated adjacent to the conductor at a remote enclosure. The conductor is identified by placing an electromagnetic probe adjacent the conductor and sensing the induced field. Another type of conductor tracer is disclosed in U.S. Pat. No. 4,686,454 also to Pecukonis. In this system a time modulated high frequency signal is added to the modulating frequency such that the waveform injected into the conductor is dc offset during the time of high frequency energy injection. At a remote end of the conductor, the transmitted signal is sensed both electrostatically and electromagnetically to form a composite signal.

There is a need for non-intrusive circuit tracer for identifying a conductor in a bundle especially under conditions where capacitive and inductive cross coupling between conductors tend to cause the tracer signal to cross over to adjacent conductors.

Further there is a need for a circuit tracer wherein the tracer signal can be applied of such low magnitude that terminating electronic circuitry can be left in place during the course of operation of the tracing operation.

SUMMARY OF THE INVENTION

The present invention, a non-intrusive circuit tracer is useful for identifying a conductor in the presence of one or more unrelated conductors in a bundle. First and second input probes are used to alternately couple a tracing signal into two independent conductors in the bundle. A single pick up probe is then used to couple a sample signal from a conductor at a location remote from the point of injection of differing tracing signals at two injection probes. By half wave synchronously demodulating a sample signal with respect to the frequency and phase of the tracing signals and then full wave synchronously demodulating the resulting signal with respect to the rate of alternation of the tracing signal between first and second conductors, the identify and relative polarity of the first and second conductors are reliably determined with respect to other conductors in the bundle. The magnitude of the tracer signal is preferably below 300 millivolts peak to peak such that for many electronic circuits, tracing can be accomplished while electronics are still connected to the conductors.

Commonly in a circuit tracer, an electrical signal is conducted or induced into an electrical conductor and that signal is sampled at a remote location. Alternating signals may be either conducted or induced and the presence of the signal determined at a remote location by a probe such as for example an electrostatic or electromagnetic probe. However, where a low level tracer signal is used, determining the identify of a particular conductor at remote end may be made ambiguous because stray inter conductor capacitance may cause a portion of the tracer signal to be coupled into other wires in the bundle. Where the "bundle" includes only one wire, an ambiguity cannot readily exist, unless the tracer frequency is so high that transmission from the source end of the conductor to the pick-up probe end of the conductor readily occurs.

Realistic conductor bundles have a plurality of conductors. By testing the continuity of two conductor's simultaneously, each conductor is not only positively identified with respect to unrelated conductors but each conductor is positively identified with respect to the other conductor.

It is an object of the present invention to provide relatively simple and inexpensive tracing system for identifying an electrical conductor in the presence of other conductors.

A further object of the invention is to provide a tracing system that effectively determines wire pairs and determines their relative polarity in the presence of other parallel running conductors.

One advantage of the present invention is that it is possible to locate and trace wiring without stripping the insulation from the individual wires of the wiring bundle. Where an electrostatic or capacitive coupling probe is used, using a larger surface area on the probe tip, the driven wires can be located in a general way. After the driven wires have been generally located, a smaller probe coupling area is used to locate the driven wires out of all of the wires in the wire bundle. This procedure greatly reduces the circuit tracing time since the number of candidate wires can quickly be reduced by using a probe with a large area.

Another advantage of the present invention is that the signal ground of the tester is not required to be connected to the signal ground of the test conductors.

Yet another advantage of the present invention is that the tracer is used not only to positively identify two conductors but identifies their respective polarities.

Still another advantage of the invention is the relatively simple circuits which accomplish the identification of the circuit. Other objects, features and advantages of the present invention will be apparent from the following detail description of the invention when considered in conjunction with the accompanying drawings.

DETAILED DESCRIPTION OF THE INVENTION

Figure 1:
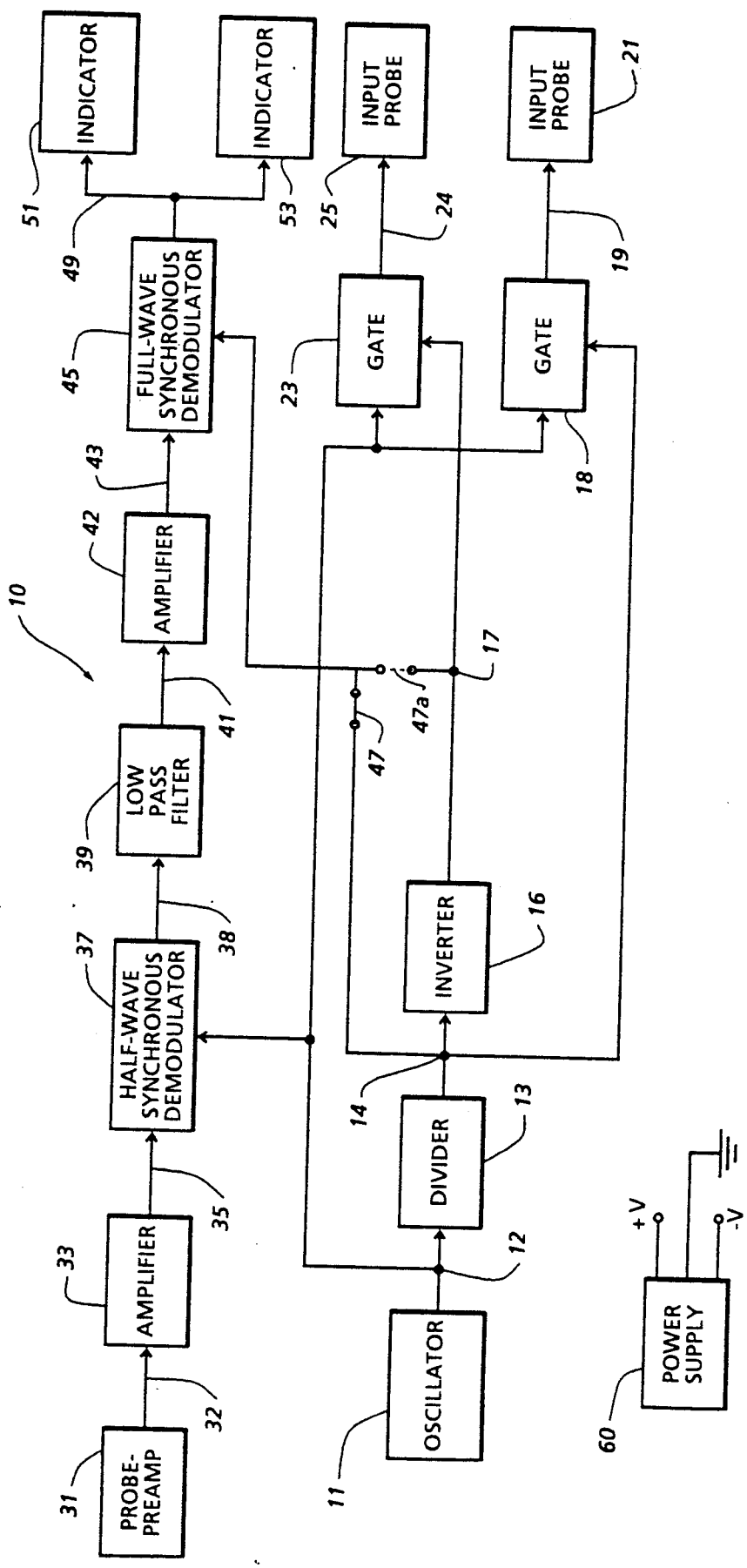
FIG. 1 is a block diagram generally illustrating the invention.
Figure 2A:
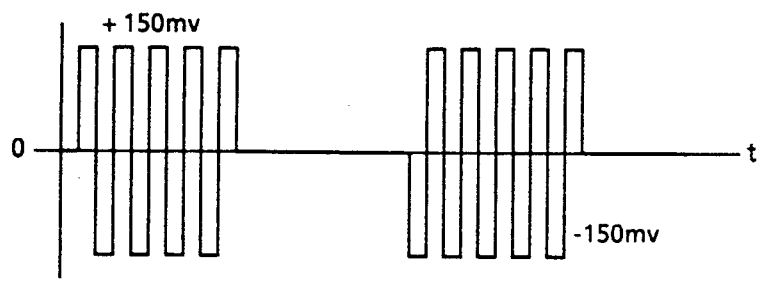
FIGS. 2a-2f are a series of waveform diagrams showing significant voltage waveforms which occur when the invention is operating.

Referring now to FIG. 1, a circuit tracer of the present invention is generally illustrated as 10. The operation of tracer 10 will be explained by appropriate reference to FIGS. 2a-2f. Oscillator 11 operates at a relatively low frequency such as for example about 50 KHZ. Preferably, oscillator 11 runs in "Square Wave" mode. Oscillator 11 is connected at node 12 with the input of divider 13. Divider 13 has a substantially square wave output voltage at node 14. The output frequency of divider 13 is substantially less than the frequency at node 12 and preferably at least one order of magnitude less than the frequency at node 12 and preferably the frequency at node 13 is related to the frequency at node 12 by f/n, where f is the node 12 frequency and n is an integer in a range inclusive of 32 and 128. Inverter 16 likewise has a substantially square wave output voltage at node 17, opposite in polarity with the voltage at node 14. First gate 18 has a signal terminal common with node 12 and a control terminal common with node 14. First gate 18 has an output voltage at node 19 generally corresponding to FIG. 2a. First input Probe 21 is excited by the voltage at node 19.

First Probe 21 in turn induces the waveform at node 19 into a conductor to be tested by convenient means such as conduction electrostatic coupling, capacitive coupling or electromagnetic coupling. Electrostatic or capacitive coupling is preferred because of its combined simplicity and non-intrusive character.

Second gate 23 has a signal terminal common with node 12 and a control terminal common with node 17. Second gate 23 has an output voltage at node 24 generally corresponding to FIG. 2c. Second input probe 25 is excited by the voltage at node 24.

Second probe 21 in turn induces the waveform at node 24 into a conductor to be tested by convenient means such as condition, electrostatic coupling, capacitive coupling or electromagnetic coupling. electrostatic or capacitive coupling is preferred because of its combined simplicity and non-intrusive character. As can be seen by comparison of FIGS. 2a and 2c, the signals induced into conductors by probes 21 and 25 are similar in character but are gated such that they are not simultaneously applied. Preferably they are gated at about 180 degree intervals of the gating frequency at 14.

Figure 4:
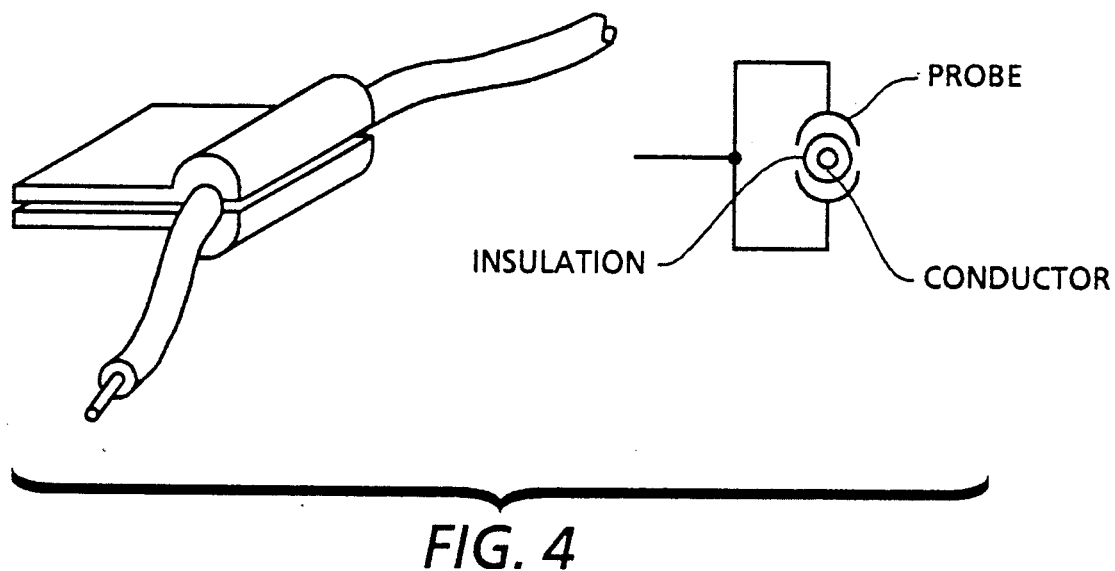
FIG. 4 is an illustration of a simple capacitive probe usable with the present invention showing the probe engaged with a conductor to be tested.

At a remote point on the bundle of conductors, pick-up probe 31 is adapted to non-conductively sense the tracer signal in conductors. A simple but effective form of sensor is illustrated schematically in FIG. 4. With this probe, the conductor is surrounded with enough surface area of a close fitting conductor to cause the injected tracer signal to be capacitively coupled into the probe. Probe 31 preferably includes a high impedance input amplifier so that the effective capacitance required may be kept small and preferably less than 1 pico farad. Sensed signal at node 32 is increased by amplifier 33 and preferably returned along transmission means 35 to a location near the input end. Transmission means 35 may be any suitable means such as for example, a fiber optic or radio frequency transmitter-receiver-decoder or where the distance is short, preferably a conductor and more preferably a shielded conductor. The essential quality of transmission means 35 is that phase integrity of the detected signal is maintained with minimal effective phase shift. The term minimum effective phase shift means that phase inversions occurring in amplifiers and modulators are permissible as long as their number is accounted for in the system as a whole.

Figure 2B:
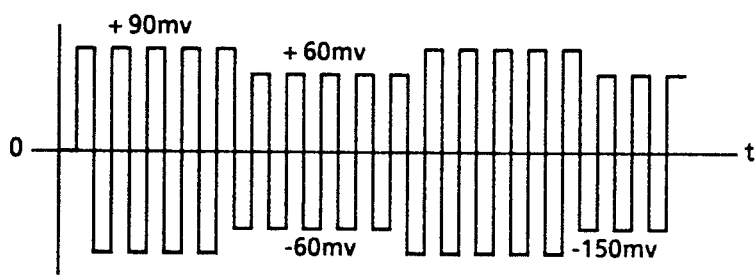
Figure 2C:
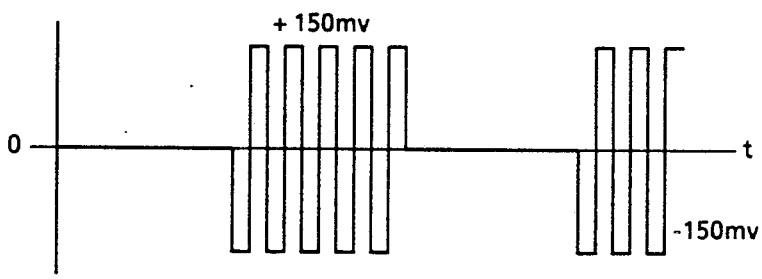
Figure 2D:
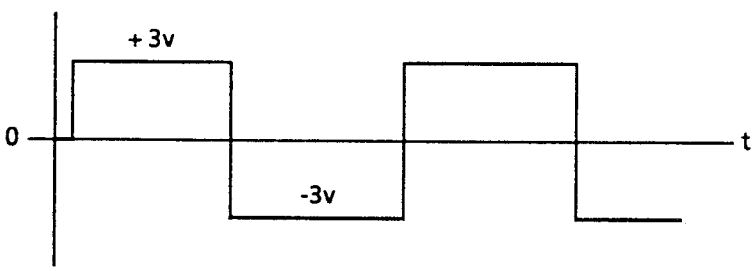
Figure 2E:
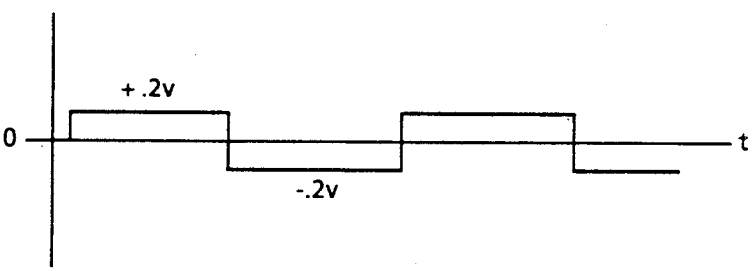
Figure 2F:
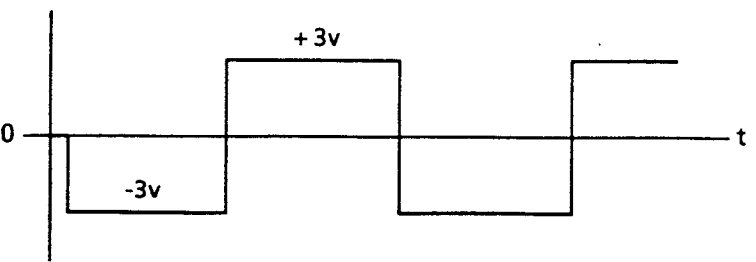

Signal from transmission means 35 serves as signal input to half wave synchronous demodulator 37. A control input of demodulator 37 is common with node 12 such that the output of demodulator 37 substantially conforms to FIG. 2d when pick-up probe 31 is operatively engaged with a conductor also operatively engaged with input probe 21; substantially conforms to FIG. 2f when pick-up probe 31 is operatively engaged with a conductor which is also operatively engaged with input probe 25; and, resembles FIG. 2e when pick-up probe 31 is operatively engaged with a conductor other than a conductor which is operatively engaged with either input probe 21 or input probe 25. FIG. 2b illustrates a waveform typically found on a conductor other than a conductor into which the 2a or 2c signal has been induced. FIG. 2e exemplifies an amplified half wave demodulated signal such as that illustrated in FIG. 2b.

The output of demodulator 37 at node 38 is an input into low-pass filter 39. Low pass filter 39 serves to stop frequencies in the range of the node 12 tracer frequency and pass frequencies in the range corresponding to the rate of alternation at node 14. Amplifier 42 increases the signal level at node 41 and provides the signal input at node 43 for full wave synchronous demodulator 45. Control input 46 for full wave synchronous demodulator 45 is common with the output of divider 13 at node 14. Alternately, control input 46 may be commonly connected with the output of inverter 16 at node 17 by removing the connection at 47 and making the connection indicated by the dashed line at 47a. The output of demodulator 45 at node 49 will be reversed when control input 46 is moved from node 14 to node 17. The source of control drive for demodulator 45 may conveniently be used as a method of accounting for phase reversals in amplifiers in transmission means 35 or elsewhere in the system.

Output of demodulator 45 at node 49 is such that: when a sufficiently large voltage at 43 is in phase with the voltage at node 14, indicator 51 is activated or when a sufficiently large voltage at 43 is of opposite phase as the voltage at node 14, indicator 53 is activated; or when the voltage at 43 is either small compared with the threshold of indicators 51 and 53 or when the voltage at node 43 is shifted between being in phase and opposite phase, the voltage at node 49 will not be sufficiently large to activate either indicator.

Figure 3:
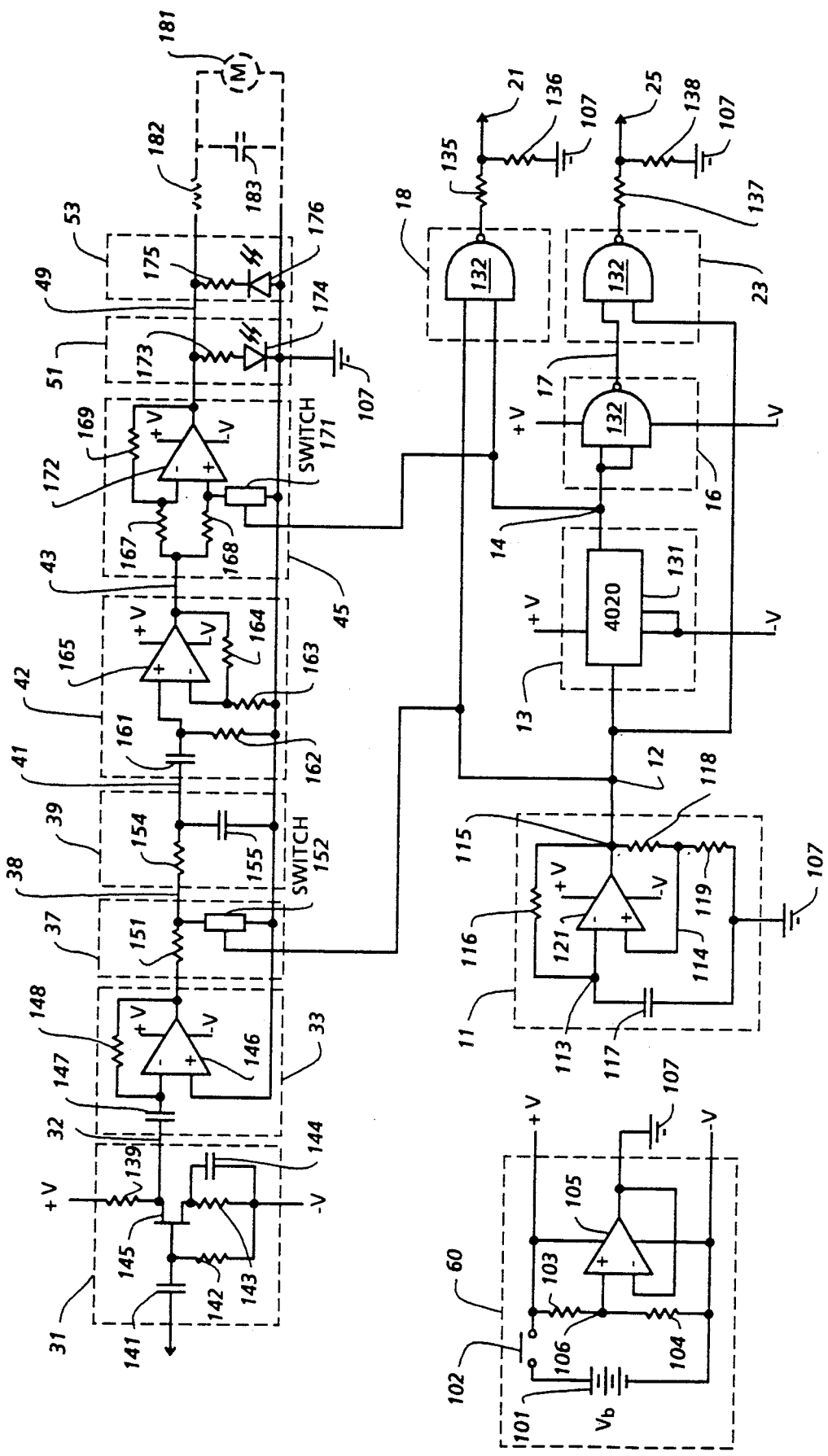
FIG. 3 is a detailed schematic of an embodiment of the present invention.

Referring now to FIG. 3, an operative embodiment of the invention is shown and is related to the block diagram illustrated in FIG. 1 through the use of common designators. Power supply 60 comprises battery 101 of voltage $V_b$ such as for example a standard 9 volt transistor battery. Switch 102 conveniently interrupts voltage from battery 101 from the remainder of the circuit so as to avoid battery drain when the circuit is not in use. Switch 102 may be a maintained contact switch but preferably it is a momentary contact switch so that battery power is required only when an actual test is required. Resistors 103 and 104 are series connected with respect to each other and parallel connected with respect to battery 101 when switch 102 is closed. Further discussion will assume that switch 102 is closed. Amplifier 105 such as for example, a Field Effect Transistor (FET) operational amplifier as manufactured by Texas Instruments and sold under product identification number TL082, is connected with the customary positive and negative power inputs respectively connected to the positive and negative terminals of battery 101. Amplifier 105 is operatively connected as a voltage follower with its non-inverting input at node 106, the common connection of resistors 103 and 104. Resistors 103 and 104 are preferably equal, effectively dividing voltage $V_b$ into plus $\frac{1}{2} V_b$ further designated as $+V$ and $-\frac{1}{2} V_b$ further designated as $-V$ when considered with respect to the output of amplifier 105 at node 107. Node 107 is illustrated as a ground symbol and is considered the test system ground to which other ground symbols in FIG. 3 refer. It is not necessary that the test system ground be common with the electrical system or cable under test. Preferably, the test system ground at 107 remains isolated from any ground in the system under test.

Oscillator 11 comprises amplifier 112 such as for example a TL082 as described above. Amplifier 112 has inverting input 113, non-inverting input 114 and output 115. Resistors 116, 118 and 119 cooperate with capacitor 117 and the inputs and outputs of amplifier 112 to form a square wave oscillator. Power is applied conventionally to the plus and minus voltage terminals of amplifier 112. The values of resistors 116, 118, and 119 and capacitor 117 are selected so that the output at 12 of oscillator 11 freely oscillates at a frequency in the ultrasonic range and preferably at about 50 khz. The wave form of the oscillation is substantially a square wave. Divider 13 preferably comprises a CMOS 4020 divider 131. Inverter 16 and gates 18 and 23 are formed using sections of a multiple gate device 132 such as for example a CMOS 4011. Resistors 135 and 136 act as attenuators to control the magnitude of signal to first input probe 21 and resistors 137 and 138 perform the same function with respect to second input probe 25. Probes 21 and 25 are preferably conducting type probes such that the signal can be placed on the conductors at a some point in the circuit where the conductor is normally not insulated. Where it is not practical to use contact probes, other forms of coupling such as capacitive coupling may also be used. For best results, capacitive probes should have a form fitting portion such that a good capacitance is formed between the probe and the conductor.

Signal is sensed at a remote point from input probes 21 and 25 by capacitive coupling as illustrated schematically by capacitor 141. Capacitor 141 represents the capacitance between a conductor and a signal probe engaged to at least partially encompass the conductor. When the conductor to be tested is insulated, the dielectric of the capacitor is the insulation of the conductor. The preamplifier portion of probe-preamp 31 uses a Field Effect Transistor 145 such as for example a 2N3819 and associated resistors 139, 142 and 143 and capacitor 144. When resistor 142 is on the order of 2.2 Megohms, the minimum effective coupling capacitance of the probe is about 0.1 picofarad. Preferably the preamplifier portion of preamp probe 31 is located near the probe portion so that the signal may be amplified with the least introduction of noise. The preamplifier may be powered by means such as a battery or may conveniently by supplied by power supply 60 as is used for the remainder of the circuitry. When a separate supply is used, the ground of the preamp and the ground of the remainder of the circuit must be at least AC coupled. Amplifier 33 includes an operational amplifier 146 which cooperates with capacitor 147 and resistor 148 to form an AC coupled amplifier. Amplifier 146 may be of the same type as amplifier 105. The output of amplifier 33 is half wave synchronously demodulated by limiting the current with resistor 151 and then switching the limited current to ground using switch 152. Switch 152 is one section of a multiple switch package such as for example a CMOS 4066. Resistor 154 and capacitor 155 form passive low pass filter 39. Another operational amplifier 165 such as for example the TL082 described above, cooperates with capacitor 161 and resistors 162, 163 and 164 to form AC coupled amplifier 42. Yet another operational amplifier 172 such as for example the TL082 described above cooperates with resistors 167, 168 and 169 and with FET switch 171 to form full wave synchronous demodulator 45. Resistors 167, 168 and 169 are of substantially equal value. FET switch 171 is a conventional switch such as for example one section of a CMOS 4066. When the signal input at 43 is in phase with the synchronizing signal at 46, the output at 49 will be negative, activating indicator 53. When the signal input at 43 is of opposite phase as synchronizing signal 46, the output at 49 will be positive, activating indicator 51. Indicators 51 and 53 preferably include limiting resistors 173 and 175 respectively and light emitting diodes (LEDs) 174 and 176 respectively. LED 174 is connected of opposite polarity with respect to ground from the ground connection of LED 176. LED 176 and LED 174 are preferably of different colors to aid in circuit identification. Resistor 182, capacitor 183 and meter 181 indicate an alternate configuration for determining relative polarity of the signals. A meter is useful under circumstances where the full wave demodulated signal strength at 49 is insufficient to activate LED 174 or LED 176.

What is claimed is:

1. A non-intrusive circuit tracer for idendifying a conductor in the presence of one or more unrelated conductors in a bundle, comprising:
   first and second input probes adapted to induce an electrical signal into first and second conductors respectively;
   means for generating a tracer signal of a predetermined frequency;
   means for alternately connecting said tracer signal to said first and second probe at a predetermined rate of alternation so as to alternately induce said tracer signal into said first and second conductors;
   pick-up probe means for sampling electrical signals present in said first conductor at a point remote from said input probes;
   means for providing a first intermediate signal by half wave synchronously demodulating said sample signal with respect to the frequency of said tracer signal;
   means for providing a second intermediate signal by full wave synchronously demodulating said first intermediate signal with respect to said rate of alternation of said tracer frequency; and, means for indicating a coincidence between one output state of said second intermediate signal and the presence of alternated tracer signal on said first conductor.

2. A non-intrusive circuit tracer as claimed in claim 1 further comprising means for indicating a coincidence between a second output state of said second intermediate signal and the presence of alternated tracer signal on said second conductor.

3. A non-intrusive circuit tracer as claimed in claim 1 wherein said rate of alternation of said tracer signals is related to said tracer signal in accordance with the expression f/n where f is the frequency of said tracer signal and n is a number greater than about 10.

4. A non-intrusive circuit tracer as claimed in claim 1 wherein said means for generating a tracer signal and alternately connecting said tracer signal to said first and second input probes at a predetermined rate of alternation further comprises:

oscillator means having an alternating output voltage of a predetermined frequency;

counter means operatively connected with said oscillator output voltage, said counter having an output alternating between a high state and a low state at a fequency corresoponding to the frequency of said oscillator divided by n, where n is a number in a range inclusive of 32 and 128;

a first electronic gate, said first gate operatively connecting said oscillator output to said first input probe when said counter output is in said high state and virtually grounding said first input probe when said counter output is in said low state; and, a second electronic gate, said second gate operatively connecting said oscillator output to said second input probe when said counter output is in said low state and virtually grounding said second input probe when said counter output is in said high state.

5. A non-intrusive circuit tracer as claimed in claim 1 further comprising an attenuator in series with each said input probe.

6. A non-intrusiuve circuit tracer as claimed in claim 5 wherein said attenuator limits the magnitude of each said tracer signal to about 300 mv peak to peak.

* * * * *